(12) United States Patent
Susko et al.

(10) Patent No.: US 6,177,728 B1
(45) Date of Patent: Jan. 23, 2001

(54) INTEGRATED CIRCUIT CHIP DEVICE HAVING BALANCED THERMAL EXPANSION

(75) Inventors: Robin A. Susko, Owego; James Wilson, Vestal, both of NY (US)

(73) Assignee: International Business Machines Corporation, Armonk, NY (US)

( * ) Notice: Under 35 U.S.C. 154(b), the term of this patent shall be extended for 0 days.

(21) Appl. No.: 09/067,707

(22) Filed: Apr. 28, 1998

(51) Int. Cl.[7] ............................ H01L 23/48; H01L 23/52; H01L 29/40
(52) U.S. Cl. ........................... 257/737; 257/738; 257/748
(58) Field of Search .................................. 257/748, 737, 257/738; 228/180.22; 438/613, 108

(56) References Cited

U.S. PATENT DOCUMENTS

| | | |
|---|---|---|
| 4,658,332 | 4/1987 | Baker et al. . |
| 4,740,414 | 4/1988 | Shaheen . |
| 4,847,146 | 7/1989 | Yeh et al. . |
| 4,873,615 | 10/1989 | Grabbe . |
| 5,026,624 | 6/1991 | Day et al. . |
| 5,049,981 * | 9/1991 | Dahringer . |
| 5,258,648 | 11/1993 | Lin . |
| 5,262,280 | 11/1993 | Knudsen et al. . |
| 5,278,010 | 1/1994 | Day et al. . |
| 5,304,457 | 4/1994 | Day et al. . |
| 5,347,162 * | 9/1994 | Pasch . |
| 5,371,404 * | 12/1994 | Juskey et al. . |
| 5,439,766 | 8/1995 | Day et al. . |
| 5,439,779 | 8/1995 | Day et al. . |
| 5,473,119 | 12/1995 | Rosenmayer et al. . |
| 5,473,814 * | 12/1995 | White . |
| 5,493,075 | 2/1996 | Chong et al. . |
| 5,496,769 | 3/1996 | Marion et al. . |
| 5,511,306 | 4/1996 | Denton et al. . |
| 5,535,101 | 7/1996 | Miles et al. . |
| 5,579,573 | 12/1996 | Baker et al. . |
| 5,633,535 | 5/1997 | Chao et al. . |

OTHER PUBLICATIONS

IBM Technical Disclosure Bulletin, pp. 85–86, vol. 40 No. 04, Apr. 1997.
09/067,708; filed Apr. 28, 1998; inventor Jimarez et al. for Methods and Apparatus for Balancing Differences in Thermal Expansion in Electric Packaging.
09/080,117; field May 15, 1998; inventor Caletka et al.. for Thermally Enhanced and Mechanically Balanced Flip Chip Package and Method of Forming.

* cited by examiner

*Primary Examiner*—David E. Graybill
(74) *Attorney, Agent, or Firm*—Patrick J. Daugherty; Driggs, Lucas, Brubaker & Hogg Co., L.P.A.

(57) ABSTRACT

CTE differentials between chips and organic dielectric carriers, boards or other substrates to which the chips are attached are accommodated with a layer of a thermoplastic material, preferably a thermotropic polymer whose physical properties can be altered by extrusion or other physical processes, such as liquid crystalline polyesters, that modifies the thermal expansion of at least one component of the package and thereby reduces CTE differentials. The material may be applied to the entire surface of a chip carrier, printed circuit or other substrate, or form an interior layer of a multi-layered structure. It may also be applied to selected regions or areas on the surface of a carrier or other substrate where adjustment is required.

16 Claims, 2 Drawing Sheets

Figure 5:
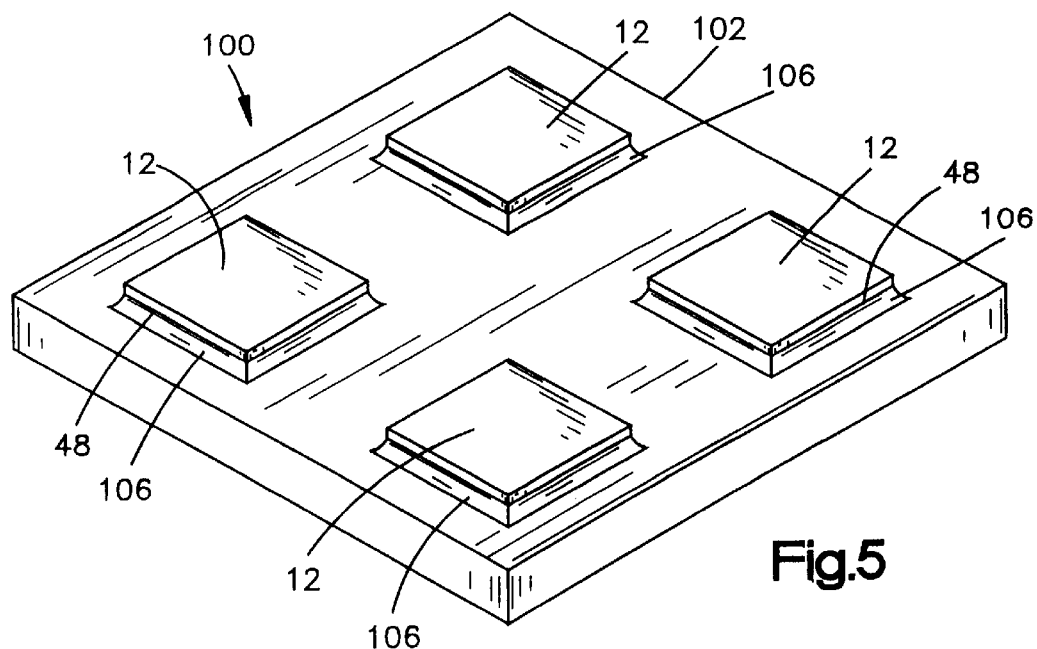

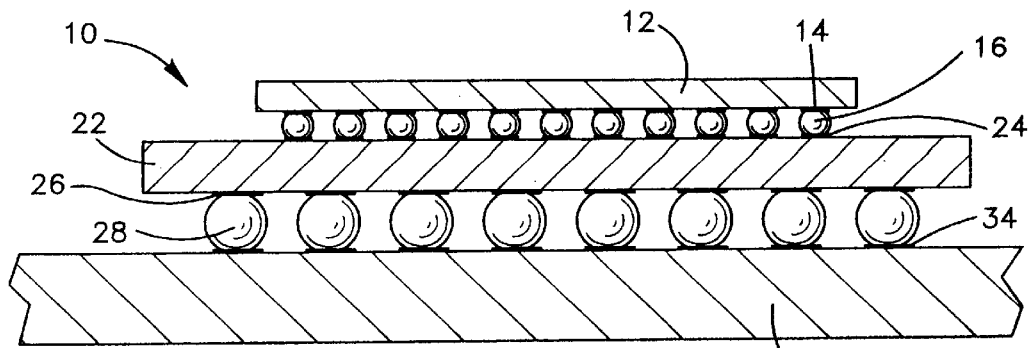
Fig.1
PRIOR ART
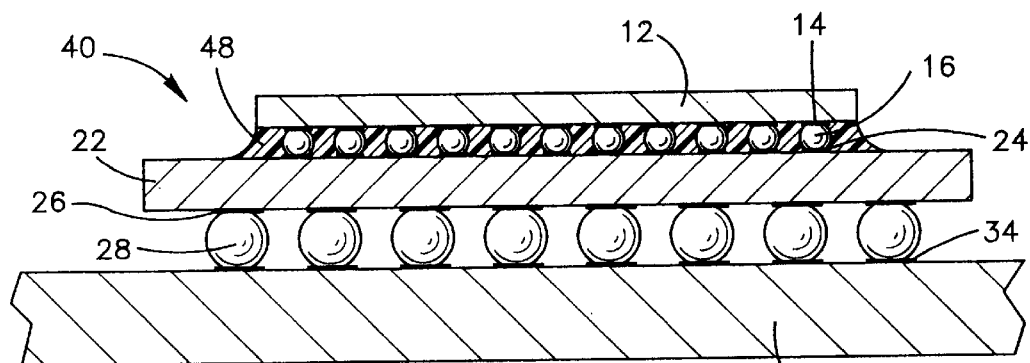
Fig.2
PRIOR ART
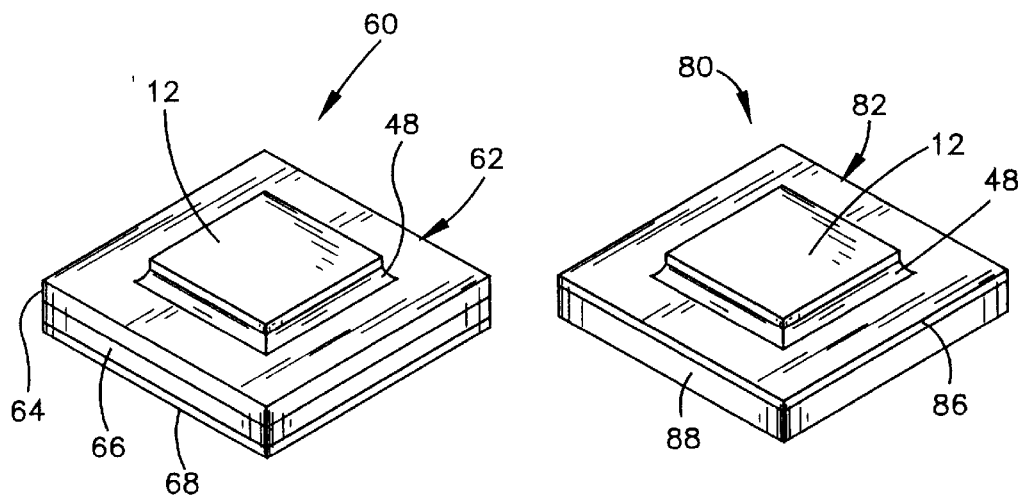
Fig.3                    Fig.4

INTEGRATED CIRCUIT CHIP DEVICE HAVING BALANCED THERMAL EXPANSION

FIELD OF THE INVENTION

This invention relates to electronic packaging and more particularly to methods and apparatus for improving the reliability of flip-chip connections by balancing differences in thermal expansion of the chip and the substrate to which it is attached.

BACKGROUND

Integrated circuit (IC) chips or modules are often connected to chip carriers, and sometimes directly to PC boards or cards, by what is commonly referred to as C4 (controlled-collapsed-chip-connection) or flip-chip attachment technology. Small bumps, drops or balls of solder are formed on an active surface of the chip. The chip is then turned over (hence the name "flip-chip") and placed on the carrier, board or other substrate to which it will be attached. The components are heated to cause the solder to reflow in a controlled collapse which completes electrical connections between the chip and substrate. This technology has numerous advantages, including compact connections, electrical performance and cost, that have made it one of the industry standards. There are certain disadvantages, however, that have prevented even wider adoption.

One of the more significant disadvantages results from differences in the coefficients of thermal expansion (CTE) of the chip and substrate. Common chip materials such as silicon, germanium and gallium arsenide usually have CTEs of about 3 to 6 ppm/° C. Circuitized organic chip carriers to which the chips are attached, which are usually composites of organic dielectrics and metallic circuitry, tend to have CTEs between about 15 and about 25 ppm/° C. So do the circuitized organic printed circuit boards and cards to which the carriers are normally attached, and to which chips are sometimes attached directly. As these components are heated and cooled the carriers, boards or cards expand and contract much more than the chips. With a simple chip to substrate connection, the strain from the unequal expansion and contraction is absorbed primarily by the soft solder. With repetitive thermal cycles, which are inescapable with many electronic components, the solder joints are likely to fail.

A conventional approach to this problem is to surround the solder joints with a dielectric underfill material that matches or approximates the CTE of the solder joints, typically about 22 to about 30 ppm/° C. Commonly used underfill materials include Dexter Hysol FP4511, Ablestik Ablebond 7717 and Polyset PCX-16-10A. They are normally heavily filled with very small particles of materials such as silicon dioxide to produce the desired CTE. The filler also gives the underfill a high Young's modulus, typically greater than 2GPa or $2.9\times10^5$ psi. The underfill absorbs most of the strain resulting from the differential expansion of the chip and substrate, which protects the solder joints. However, by restricting the expansion of the substrate, the relatively stiff underfill has a tendency to warp the carrier, board or other substrate to which the chip is attached. When a carrier is attached to a printed circuit board or card, warping the carrier generates tensile forces in the ball grid array between the carrier and the board or card which reduce the reliability of the ball grid array.

There have been many attempts to mitigate these problems, including stiffeners with a desirable CTE and layers of material such as Copper-Invar-Copper (CIC) within a multi-layer organic substrate. Stiffeners are expensive, however, and CIC has several inherent problems, not the last of which is the difficulty in drilling through it for Z axis conductors or vias. Thus, the need for reliable and inexpensive ways to compensate for differential thermal expansion between chips and circuitized organic substrate such as chip carriers and printed circuit boards remains.

SUMMARY OF THE INVENTION

The packages and methods of this invention compensate for CTE differentials between chips and the organic dielectric carriers, boards or other substrates to which the chips are attached with a layer of a thermoplastic material that modifies the CTE of at least one component of the package and thereby reduces CTE differentials. As may be seen in the accompanying drawings and the following Detailed Description, the thermoplastic material may be applied to the entire surface of a chip carrier, printed circuit or other substrate, or form an interior layer of a multi-layered structure. It may also be applied to selected regions or areas on the surface of a carrier or other substrate where adjustment is required. For example, a localized application may be preferable for carriers that hold a number of chips.

The thermoplastic material is preferably a thermotropic polymer, i.e., a polymer whose physical properties can be altered by extrusion or other physical processes. Liquid crystalline polyesters are especially preferred because these polyesters have an ordered morphology, and excellent mechanical properties can be achieved through processing variations. As will be seen below, coefficients of thermal expansion can be varied over a wide range to suit objectives of this invention. These materials are thermally conductive, have good dielectric properties and adhesive strength, and can be readily drilled to form plated through holes or PTHs. Since they are thermoplastic, they are reworkable and do not release significant quantities of volatile materials.

DRAWINGS

FIGS. 1 and 2 are schematic cross-sectional views of prior art electronic packages.

FIGS. 3, 4 and 5 are perspective representations of electronic packages embodying this invention.

FIGS. 6 and 7 are schematic cross-sectional views of other electronic package embodying this invention.

DETAILED DESCRIPTION

FIG. 1 illustrates a conventional electronic package, generally referred to as 10, with a bare chip 12 connected to a circuitized carrier 22 by C4 connections. As is customary with C4 technology, drops, bumps or balls 16 of solder are attached to contacts 14 on the integrated circuit chip or module 12 with the chip inverted so that the contacts 14 are on top. The chip is then flipped into the illustrated position and the solder balls 16 are aligned with contacts 24 on circuitized carrier 22. The package is then heated to reflow the solder balls 16 and complete the C4 connections between chip 12 and carrier 22. Conventional electrical circuitry (not shown) in the carrier connects the contacts 24 on top of the carrier to a second set of contacts 26 on the bottom of the carrier. A second set of solder balls 28, somewhat larger than the balls 16 that attached the chip 10 to the carrier, is attached to the contacts 26 beneath the carrier. This array of balls 28, conventionally referred to as a Ball Grid Array or BGA, connect contacts 26 to contacts 34 on a printed circuit board, card or other substrate 32. The solder in the BGA balls 28 may be selected to melt at a lower temperature than the solder in the C4 balls 16, so that chip and carrier can be attached to substrate 32 without disturbing the C4 connections.

Conventional chip materials such as silicon, germanium and gallium arsenide have coefficients of thermal expansion of about 3 to about 6 ppm/° C. They are commonly attached to carriers, printed circuit boards and other substrates manufactured with organic dielectrics such as glass filled epoxies, polyimides and the like. Circuitized carriers, boards and other substrates made of these organic dielectrics typically have CTEs of 15 to 25 ppm/° C. Despite this CTE mismatch, circuitized organic dielectrics are used in most applications because they have a number of advantages over other materials (such as ceramics) which have CTEs closer to the CTE of the chip. The use of materials with this CTE mismatch does create problems, however. When package 10 is heated or cooled the lateral expansion or contraction of carrier 22 is substantially greater than the lateral expansion or contraction of the chip 12. This creates a shear strain on the C4 solder balls 16. Many electronic components routinely experience thermal cycles in their ordinary operation, and these cycles are sometimes aggravated by environmental conditions. Thermal cycles in excess of 30° C. are common. Under extreme operating or environmental conditions they may exceed 100° C. The stress/strain inflicted on the C4 connections by these cycles is one of the primary causes for premature failure of these connections.

FIG. 2 illustrates another package 40 incorporating one conventional approach to the CTE mismatch problem. The parts of package 40 are essentially the same as those in package 10, except that package 40 has an underfill layer 48 surrounding the C4 solder balls, between the chip 12 and carrier 22. Underfill 48, which may be any of a number of commercially available materials designed for this purpose, is normally dispensed around the periphery of the chip after it has been attached to the substrate, is drawn into the spaces between the C4 connections by capillary action, and then cured and solidified. The underfill may also be applied to the chip or the carrier and cured simultaneously with the C4 reflow. The solidified underfill bears most of the load generated by differences in expansion and contraction of chip 12 and carrier 22, which substantially reduces strain on the C4 connections 16.

As mentioned above, underfill materials normally contain considerable amounts of very small particles of materials such as silicon dioxide. The particles are added to the material to give the underfill 48 a CTE substantially equal to the CTE of solder balls 16, which typically have a CTE of about 22 ppm/° C. These coefficients must be matched to keep the underfill from alternately stretching and compressing the C4 balls in the direction normal to the chip surface, which could also produce premature failure. The particulate additions, however, give the underfill materials a high Young's modulus, typically greater than 2GPa or 2.9×10$^5$ psi. When a package of the type illustrated in FIG. 2 is thermally cycled, the CTE differences and strong coupling between the chip 14 and the carrier 22 tend to warp both the chip and the carrier. This can crack the silicon chip. On cooling, as when the package is cooled after completion of the BGA connections 28 between carrier 22 and substrate 32, warping of the chip and carrier puts a tensile load on the balls 28 at the center of the ball grid array between the carrier and substrate, which can cause premature failure. Thus, an underfill layer by itself is not an entirely satisfactory solution.

FIG. 3 illustrates an electronic package 60 embodying this invention, which substantially reduces bending or warpage from CTE differentials and the attendant risk of BGA and/or chip failure. Package 60 includes a carrier 62 with a balancing layer 66 of thermotropic polymer, typically a few mils thick, sandwiched between an upper layer 64 and lower layer 68, both of which are conventional glass-filled epoxy, polyimides or the like.

Preferred thermotropic polymers include the liquid crystalline polyesters described in U.S. Pat. No. 4,818,812 to Economy et al. (the disclosure of which is incorporated by reference). These polymers contain about 25 to about 100 mole percent of recurring Unit I and O to about 75 mole percent of recurring Unit II wherein:

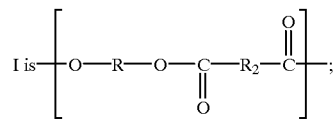

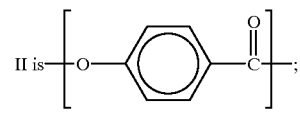

and each R and R$_2$, individually, is an arylene group, a cycloalkylene group, aklylene group or mixture thereof.

Especially preferred materials include the polymer disclosed in Example 2 of the Economy et al patent, which is produced with about 35.66 parts by weight of 2-chloro 1,4 diacetoxybenzene, about 26.86 parts by weight of trans 1,4-cyclohexanedicarboxylic acid, and about 37.47 parts by weight of 4-acetoxy benzoic acid and the polymer disclosed in Example 4, which is produced with about 39.59 parts by weight of 1,4-diacetoxy-2-phenyl benzene, about 25.22 parts by weight of trans 1,4 cyclohexanedicarboxylic acid and about 35.19 parts by weight of 4-acetoxy benzoic acid.

These thermotropic liquid crystalline polyesters may be readily processed to have CTEs of 5 to 20 ppm/° C. With certain materials and processing techniques, the CTE can be as low as about minus 5 ppm/° C., but that level of CTE adjustment is not normally required to achieve superior results with the methods and structures of this invention. If the thermotropic liquid crystalline polymer in layer 66 has a CTE of five ppm/° C. and makes up one-half of the overall thickness of substrate 61, and the upper layer 64 and bottom layer 68 of the substrate are each made of glass filled epoxy having a CTE of 20 ppm/° C., together forming the remaining half of the thickness of carrier 62, the average CTE of carrier 62 will be 12.5 ppm/° C. Thus, the differential between the CTE of chip 12 and substrate 62 has been effectively reduced by about 50%. This brings the strain on the C4 solder connections between the chip and carrier, and warping of the chip and carrier, within acceptable limits for many applications.

FIG. 4 illustrates another package 80 embodying this invention, in which carrier 82 has a layer 86 of thermotropic polymer, preferably of about the same thickness as the layer 66 of thermotropic polymer in FIG. 3, applied to the surface of a circuitized glass filled epoxy substrate 88. Layer 86 is applied to the surface of carrier 82 before chip 12 is attached. Contacts and other conventional circuitry (not shown) are applied to the top of thermotropic layer 86, the chip is attached to these contacts, and underfill layer 48 is applied and cured by conventional methods.

Moving thermotropic layers up or down in carriers and other substrates as illustrated, for example, in FIGS. 3 and 4 enables us to control CTE mismatch at particular locations. Therefore, there should be a careful selection of a proper cross-section within the package to get optimal mechanical performance.

FIG. 5 shows a package 100 with four chips 12 are attached to a circuitized organic dielectric multichip carrier 102 with C4 connections (not shown). Each chip 12 is separated from the carrier 102 by an individual patch 106 of thermotropic polymer and an individual patch 48 of underfill. This makes it possible to tailor CTE balancing to different chips in a common package. Four chips are illustrated, but carriers may hold a. multiplicity of chips and devices depending on the application.

Figure 6:
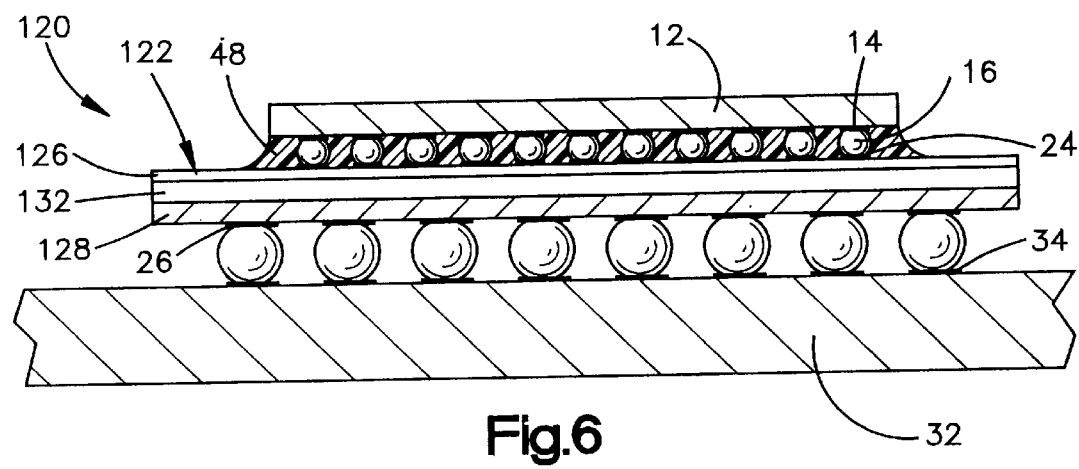

FIGS. 6 illustrates another embodiment in which coefficients of thermal expansion are adjusted to achieve particularly desired levels at different points in a carrier 120. The illustrated multi-layered carrier 120 has a layer 126 of a thermotropic polymer having a CTE of about 3 pm on the side of the carrier nearest to the chip 12, which also has a CTE of about 3 ppm/° C. This layer should be a few mils thick. A layer 128 of glass-filled epoxy or other conventional organic dielectric (also be a few mils thick) having a CTE of about 20 ppm/° C. forms the bottom of carrier 122, nearest to the printed circuit board 32 to which it is attached, which also has a CTE of about 20 ppm/° C. A layer 132 of an elastic compliant material such as PYRALUX LF0131, a polyamide available from E. I. DuPont, or THERMATTACH T413, a filled acrylic available from Chomerics, joins the upper balancing layer 126 of thermotropic polymer to the lower layer of conventional FR-4 dielectric. Elastic layer 132, which may also be a few mils thick, effectively decouples the balancing layer and the lower layer, and absorbs shear strains without undue warping of the carrier 122 or chip 12.

Figure 7:
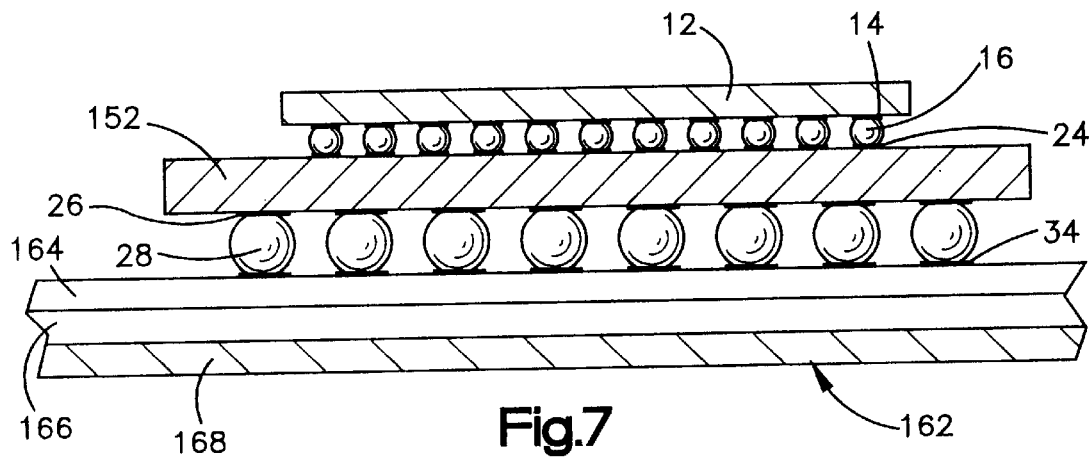

FIG. 7 illustrates yet another embodiment of this invention in which a layer 166 of thermotropic polymer reduces the overall co-efficient of thermal expansion of a multi-layered substrate. In this embodiment the multi-layer substrate is a printed circuit board or card 162, having an upper layer 164 and lower layer 168, both of which comprise a glass filled epoxy, polyimide or other conventional organic dielectric material, with a layer 166 of a thermotropic polymer such as the liquid crystalline polyesters discussed above between upper layer 164 and lower layer 168. An integrated circuit chip 12 is connected by C4 connections 16 to a ceramic chip carrier 152, which has a coefficient of thermal expansion of about 8–10 ppm/° C. The ceramic chip carrier 152 is connected by an array of solder balls 28 to contacts 34 on the upper surface of printed circuit board or cord 162. If the entire printed circuit board or card were made of a typical circuitized organic dielectric material with a CTE of about 15–25 ppm/° C., the differences between the thermal expansion of the ceramic carrier 152, and the co-efficient of thermal expansion of the printed circuit board or card 162 would produce shearing stresses and strains on the BGA solder balls 28 that would be undesirable and perhaps unacceptable. However, in the structure illustrated in FIG. 7 these stresses and strains are reduced to acceptable levels by the balancing layer 166 of thermotropic polymer, which may be about 10 to 20 and is preferably about 15 mils thick and preferably has a CTE of about 5 ppm/° C. This layer may form about 40 to 60% of the thickness of the printed circuit board or card, and reduces the overall or average coefficient of thermal expansion of the board to about 12 ppm/° C. This reduces shearing stresses and strains on the BGA solder balls 28 significantly and brings them within acceptable levels.

As those skilled in the art will appreciate from the foregoing description, this invention provides an effective, practical and cost effective method for reducing warping in packages with flip-chip attachments to circuitized organic dielectric substrates. These improvements are achieved without creating the alternative problems that plagued prior approaches to this problem. Of course, those skilled in the art will also appreciate that many modifications may be made to the materials, structures and methods disclosed above within the scope of this invention, which is defined by the following claims.

We claim:

1. A electronic package comprising:
   an integrated circuit chip having contacts on at least one surface;
   a circuitized organic chip carrier having a surface facing said chip, with carrier contacts on said surface;
   solder connections between at least some of said chip contacts and at least some of said carrier contacts; and
   a layer of a thermoplastic material adapted to modify the thermal expansion of at least one of said chip carrier and said solder connections and thereby reduce the difference between the coefficient of thermal expansion for the chip and the resultant coefficient of thermal expansion for the combination of the thermoplastic material and the at least one of said chip carrier and said solder connections;
   wherein said thermoplastic material comprises a thermotropic liquid crystalline polymer.

2. A package according to claim 1 wherein said polymer comprises a polyester.

3. A package according to claim 2 wherein said polyester comprises about 25 to about 100 mole percent of recurring Unit I and O to about 75 mole percent of recurring Unit II wherein:

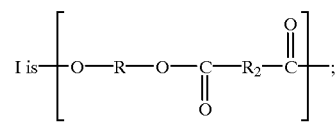

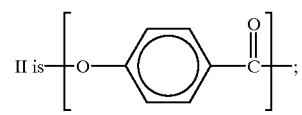

and each R and $R_2$, individually, is an arylene group, a cycloalkylene group, an alkylene group or a mixture thereof.

4. A package according to claim 1 wherein said carrier comprises:
   a first circuitized organic dielectric layer on the surface of said carrier said chip;
   a second circuitized organic dielectric layer on a surface of said carrier opposite to said first layer; and
   a layer of said thermoplastic material between said first layer and said second layer.

5. A package according to claim 1, further comprising an underfill layer around the solder connections between the chip and the substrate, wherein said layer of thermoplastic material is positioned between said underfill layer and said substrate.

6. An electronic system comprising:

an integrated circuit chip;

a first substrate having a first set of contacts on a first surface and a second set of contacts on a second surface opposite said first surface, with contacts in said second set electrically connected to contacts in said first set;

an array of solder connections between said chip and said first substrate;

a second substrate having contacts on at least one surface;

an array of solder connections between contacts on said second substrate and said second set of contacts on said first substrate; and a layer of a thermoplastic material adapted to modify the thermal expansion of at least one of said first and second substrates and said solder connections and thereby reduce the difference between the coefficient of thermal expansion for the chip and the resultant coefficient of thermal expansion for the combination of the thermoplastic material and the at least one of said first and second substrates and said solder connections, wherein said thermoplastic material comprises a thermotropic liquid crystalline polymer.

7. A system in accordance with claim 6 wherein said first substrate comprises a circuitized organic chip carrier and said layer of thermoplastic material comprises one layer of said chip carrier.

8. A system in accordance with claim 7 wherein said carrier comprises at least two layers of one or more organic dielectric materials having coefficients of thermal expansion of at least about 15 ppm/° C. and said layer of thermoplastic material is positioned between said layers of dielectric material.

9. A system in accordance with claim 7, wherein said layer of thermoplastic material is at or near a surface of said carrier facing said chip.

10. A system in accordance with claim 7, further comprising a layer of underfill material around the solder connections between said chip and said carrier.

11. A system in accordance with claim 7 wherein said carrier comprises:

a layer of said thermoplastic material on the surface of said carrier facing said chip;

a layer of circuitized organic dielectric material on the surface of said carrier opposite to said layer of thermoplastic materials; and a layer of compliant material having a Young's modulus substantially lower than the Young's modulus of said layer of thermoplastic material and said layer of organic dielectric material.

12. A system in accordance with claim 7 wherein a number of chips are connected to said carrier and a number of patches of said thermoplastic material are applied to a surface of said carrier, between said chips and said carrier.

13. A system in accordance with claim 6 wherein said second substrate comprises a circuitized organic printed circuit board or card and said layer of thermoplastic material comprises one layer of said printed circuit board or card.

14. A system in accordance with claim 13 wherein said printed circuit board or card comprises at least two layers of one or more organic dielectric materials having coefficients of thermal expansion of at least about 15 ppm/° C. and said layer of thermoplastic material is positioned between said layers of dielectric materials.

15. A system in accordance with claim 14 wherein said thermotropic liquid crystalline polyester has a coefficient of thermal expansion of about minus 5 to about 20 ppm/s° C.

16. A system in accordance with claim 13 wherein said first substrate comprises a ceramic chip carrier.

* * * * *